(12) United States Patent
Hsu et al.

(10) Patent No.: US 10,896,882 B2
(45) Date of Patent: Jan. 19, 2021

(54) ELECTRONIC PACKAGE HAVING HEAT DISSIPATING ELEMENT AND METHOD FOR FABRICATING THE SAME

(71) Applicant: PHOENIX & CORPORATION, Grand Cayman (KY)

(72) Inventors: Shih-Ping Hsu, Hsinchu County (TW); Che-Wei Hsu, Hsinchu County (TW); Chih-Kuai Yang, Hsinchu County (TW)

(73) Assignee: PHOENIX & CORPORATION, Grand Cayman (KY)

( * ) Notice: Subject to any disclaimer, the term of this patent is extended or adjusted under 35 U.S.C. 154(b) by 42 days.

(21) Appl. No.: 16/354,267

(22) Filed: Mar. 15, 2019

(65) Prior Publication Data
US 2019/0214349 A1    Jul. 11, 2019

(30) Foreign Application Priority Data

Dec. 19, 2017  (TW) .............................. 106144592 A

(51) Int. Cl.
| | |
|---|---|
| H01L 23/00 | (2006.01) |
| H01L 21/48 | (2006.01) |
| H01L 21/56 | (2006.01) |
| H01L 21/78 | (2006.01) |
| H01L 23/31 | (2006.01) |
| H01L 23/367 | (2006.01) |
| H01L 23/538 | (2006.01) |
| H01L 23/433 | (2006.01) |
| H01L 23/36 | (2006.01) |

(52) U.S. Cl.
CPC ........ *H01L 23/562* (2013.01); *H01L 21/4853* (2013.01); *H01L 21/4871* (2013.01); *H01L 21/565* (2013.01); *H01L 21/78* (2013.01); *H01L 23/3121* (2013.01); *H01L 23/36* (2013.01); *H01L 23/367* (2013.01); *H01L 23/4334* (2013.01); *H01L 23/5386* (2013.01)

(58) Field of Classification Search
CPC .................................................... H01L 23/562
USPC ........................................................ 257/717
See application file for complete search history.

(56) References Cited

U.S. PATENT DOCUMENTS

| | | | | |
|---|---|---|---|---|
| 7,719,096 B2* | 5/2010 | Chou | ................ | H01L 23/49562 257/675 |
| 2002/0053722 A1* | 5/2002 | Sakamoto | ............ | H05K 1/0204 257/678 |
| 2012/0061716 A1* | 3/2012 | Yu | ......................... | H01L 33/486 257/99 |
| 2019/0109064 A1* | 4/2019 | Kao | .................... | H01L 23/3157 |

* cited by examiner

*Primary Examiner* — Jami Valentine Miller
(74) *Attorney, Agent, or Firm* — Amin, Turocy & Watson, LLP

(57) ABSTRACT

An electronic package and a method for fabricating the same are provided. The method includes bonding a portion of an inactive surface of an electronic component to a thermal conductive layer of a heat dissipating element, encapsulating the electronic component and the thermal conductive layer with an encapsulant, and forming a circuit structure on the encapsulant and electrically connecting the circuit structure to the electronic component. Since the heat dissipating element is bonded to the electronic component through the thermal conductive layer, the heat dissipating effect of the electronic package is improved.

18 Claims, 6 Drawing Sheets

ELECTRONIC PACKAGE HAVING HEAT DISSIPATING ELEMENT AND METHOD FOR FABRICATING THE SAME

BACKGROUND

1. Technical Field

The present disclosure relates to electronic packages, and, more particularly, to an electronic package and a method for fabricating the same.

2. Description of Related Art

Along with the progress of semiconductor packaging technologies, various types of packages have been developed for semiconductor devices. A ball grid array (referred to as BGA), such as PBGA, EBGA, FCBGA and the like, is an advanced semiconductor packaging technology, which involves attaching a semiconductor element to a surface of a packaging substrate and mounting a plurality of solder balls arranged in a grid array to an opposite surface of the packaging substrate. As such, the packaging substrate can be bonded and electrically connected to an external electronic device through the solder balls. In this manner, more I/O connections are provided on a unit area of the packaging substrate, i.e., the carrier, so as to meet the high integration requirement of the semiconductor element.

FIGS. 1A to 1E are schematic cross-sectional views showing a method for fabricating a semiconductor package 1 according to the prior art.

Referring to FIG. 1A, a wiring build-up layer structure 11 is formed on a copper clad laminate 10. The wiring build-up layer structure 11 has a first side 11a bonded to the copper clad laminate 10 and a second side 11b opposite to the first side 11a. Further, a solder mask layer 12b is formed on the second side 11b of the wiring build-up layer structure 11.

Referring to FIG. 1B, the copper clad laminate 10 is removed and another solder mask layer 12a is formed on the first side 11a of the wiring build-up layer structure 11.

Referring to FIG. 1C, a semiconductor chip 13 is disposed on the first side 11a of the wiring build-up layer structure 11 in a flip-chip manner through a plurality of solder bumps 130, and then an encapsulant 14 is formed to encapsulate the semiconductor chip 13 and the solder bumps 130.

Referring to FIG. 1D, a plurality of heat sinks 15 are disposed on the encapsulant 14 through an adhesive 16.

Referring to FIG. 1E, a singulation process is performed along cutting paths L of FIG. 1D to obtain a plurality of semiconductor packages 1. Further, a plurality of solder balls 17 are formed on exposed circuits of the second side 11b of the wiring build-up layer structure 11.

Referring to FIG. 1F, in the process of FIG. 1C, an underfill 18, replacing the encapsulant 14, is formed to encapsulate the solder bumps 130 and the back surface of the semiconductor element 13 is exposed. Accordingly, in the process of FIG. 1D, the heat sink 15 is disposed on the back surface of the semiconductor chip 13 through the adhesive 16.

However, in the conventional semiconductor package 1, the circuits in the wiring build-up layer structure 11 is generally made of copper. Since the solder bumps 130 are bonded to such a heterogeneous metal, both heat dissipating and electrical performances between the wiring build-up layer structure 11 and the semiconductor chip 13 are adversely affected.

Further, attaching the heat sink 15 to the back surface of the semiconductor chip 13 complicates the fabrication process.

Furthermore, the adhesive 16 is used by the heat sink 15 as a thermal conductive interface, which adversely affects the heat dissipating effect.

In addition, referring to FIG. 1E, in addition to the heat sink 15 and the adhesive 16, heat needs to further pass through the encapsulant 14 to be dissipated, thus greatly reducing the heat dissipating effect of the electronic package 1.

Therefore, the semiconductor package 1 is not applicable to high power management ICs or related products with a high heat dissipating requirement. Accordingly, another semiconductor package is developed.

FIGS. 2A to 2C are schematic cross-sectional views showing a method for fabricating a semiconductor package 2 according to the prior art.

Referring to FIG. 2A, a plurality of semiconductor chips 23 are disposed on an adhesive tape 26 of a heat sink 25, and then an encapsulant 24 is formed on the adhesive tape 26 to encapsulate the semiconductor chips 23.

Referring to FIG. 2B, a wiring build-up layer structure 21 is formed on the encapsulant 24 and the semiconductor chips 23 and electrically connected to the semiconductor chips 23 through a plurality of conductive vias. The conductive vias are formed by laser drilling. Thereafter, a solder mask layer 22 is formed on the wiring build-up layer structure 21 and a portion of the wiring build-up layer structure 21 is exposed from the solder mask layer 22.

Referring to FIG. 2C, a singulation process is performed along cutting paths L of FIG. 2B to obtain a plurality of semiconductor packages 2, and a plurality of solder balls 27 are disposed on the exposed portion of the wiring build-up layer structure 21. Therefore, the wiring build-up layer structure 21 is directly bonded to the semiconductor chips 23 instead of through solder bumps, thus greatly improving heat dissipating and electrical performances between the wiring build-up layer structure 21 and the semiconductor chips 23. Hence, the semiconductor package 2 is applicable to high power management ICs or related products with a high dissipating requirement.

However, attaching the heat sink 25 to the back surfaces of the semiconductor chips 23 complicates the fabrication process. Also, the adhesive tape 26 is used by the heat sink 25 as a thermal conductive interface, which adversely affects the heat dissipating effect.

Furthermore, uneven thermal stresses may occur due to a CTE (coefficient of thermal expansion) mismatch between the semiconductor chips 23 and the adhesive tape 26 provided on the entirety of the back surface of the semiconductor chips 23. Consequently, the adhesive tape 26 may warp and peel off during a subsequent thermal cycling process such as heating or baking, thereby causing delamination of the heat sink 25.

Therefore, how to overcome the above-described drawbacks has become critical.

SUMMARY

In view of the above-described drawbacks, the present disclosure provides an electronic package, which comprises: a heat dissipating element having a thermal conductive layer; an electronic component disposed on the heat dissipating element, wherein the thermal conductive layer is positioned in a space formed between the electronic component and the heat dissipating element and comes into contact with the heat dissipating element and the electronic component; an encapsulant formed on the heat dissipating element and in the space formed between the electronic component and the heat dissipating element to encapsulate the electronic component; and a circuit structure formed on the encapsulant and electrically connected to the electronic component.

The present disclosure further provides a method for fabricating an electronic package, which comprises: disposing an electronic component on a heat dissipating element having a thermal conductive layer, wherein the thermal conductive layer is positioned in a space formed between the electronic component and the heat dissipating element and comes into contact with the heat dissipating element and the electronic component; forming an encapsulant on the heat dissipating element and in the space formed between the electronic component and the heat dissipating element to encapsulate the electronic component; and forming a circuit structure on the encapsulant and electrically connecting the circuit structure to the electronic component.

In an embodiment, one portion of the heat dissipating element is in contact with the thermal conductive layer, and another portion of the heat dissipating element is in contact with the encapsulant.

In an embodiment, the thermal conductive layer is a metal layer.

In an embodiment, a surface of the electronic component has one portion in contact with the thermal conductive layer and another portion in contact with the encapsulant.

In an embodiment, the encapsulant is made of a molding compound or a primer.

In an embodiment, the circuit structure comprises a first circuit portion formed in the encapsulant and electrically connected to the electronic component, an insulating layer formed on the encapsulant, and a second circuit portion embedded in the insulating layer.

In another embodiment, the insulating layer is made of a molding compound or a primer According to the present disclosure, the thermal conductive layer and the encapsulant are formed in the space between the electronic component and the heat dissipating element. The encapsulant is only bonded to a portion of the back surface of the electronic component, and the other portion of the back surface of the electronic component is bonded to the thermal conductive layer, thereby greatly improving the heat dissipating effect of the electronic package.

Further, since the thermal conductive layer is encapsulated by the encapsulant, the present disclosure strengthens the bonding between the electronic component and the thermal conductive layer. Furthermore, the thermal conductive layer facilitates to disperse thermal stresses of the encapsulant. Therefore, the present disclosure avoids warping of the thermal conductive layer and the encapsulant in the space during a subsequent thermal cycling process so as to prevent peeling of the thermal conductive layer and hence prevent delamination of the heat dissipating element.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 3A to 3D are schematic cross-sectional views of an electronic package 3 according to the present disclosure.

Figure 1A:
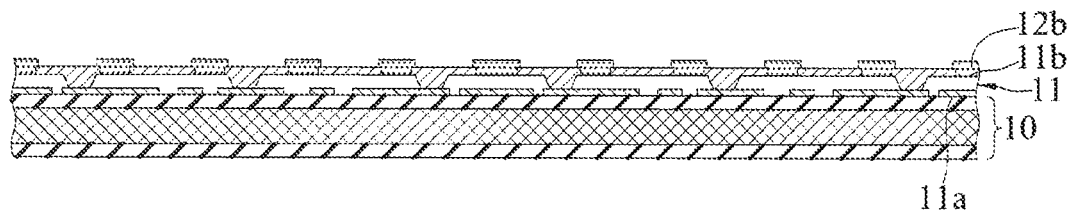
FIGS. 1A to 1E are schematic cross-sectional views showing a method for fabricating a semiconductor package according to the prior art.
Figure 1B:
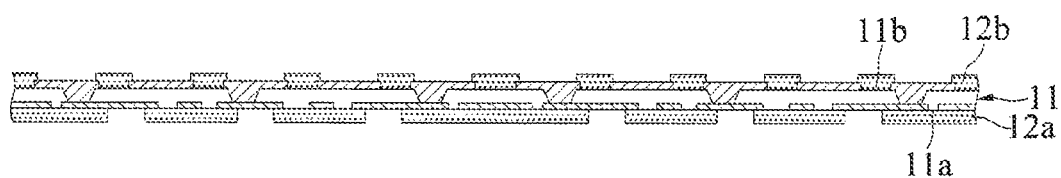
Figure 1C:
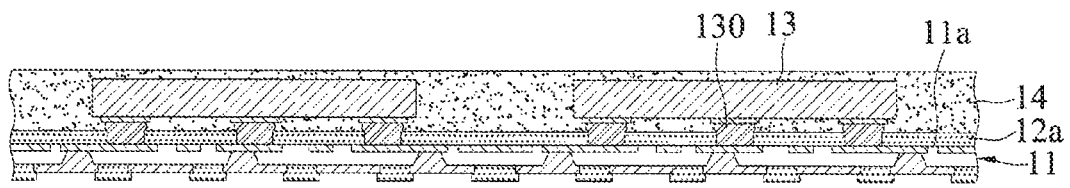
Figure 1D:
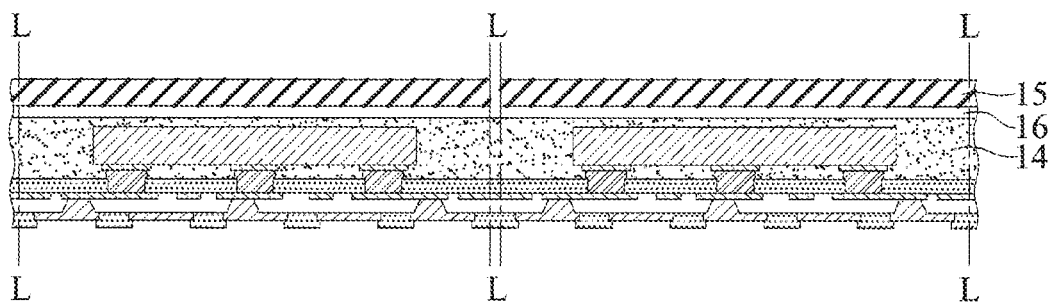
Figure 1E:
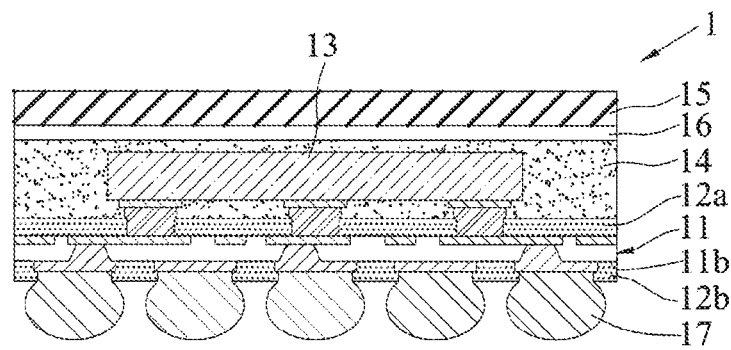
Figure 1F:
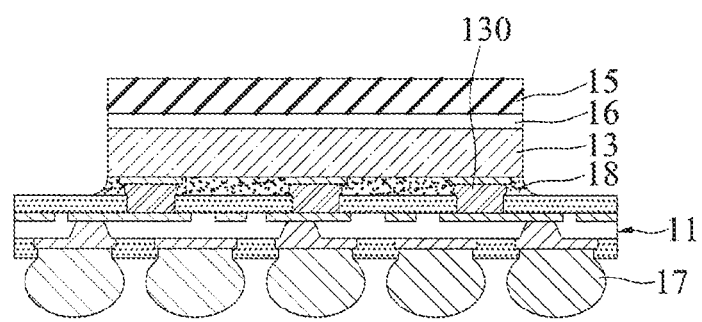
FIG. 1F shows another embodiment of FIG. 1E.
Figure 2A:
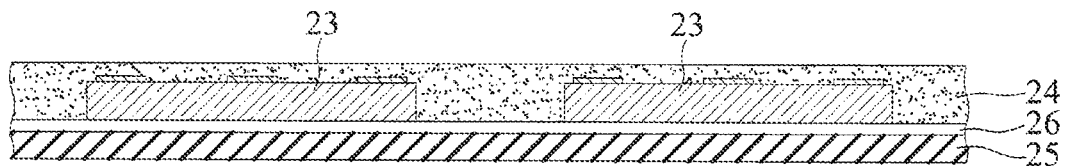
FIGS. 2A to 2C are schematic cross-sectional views showing another method for fabricating a semiconductor package according to the prior art.
Figure 2B:
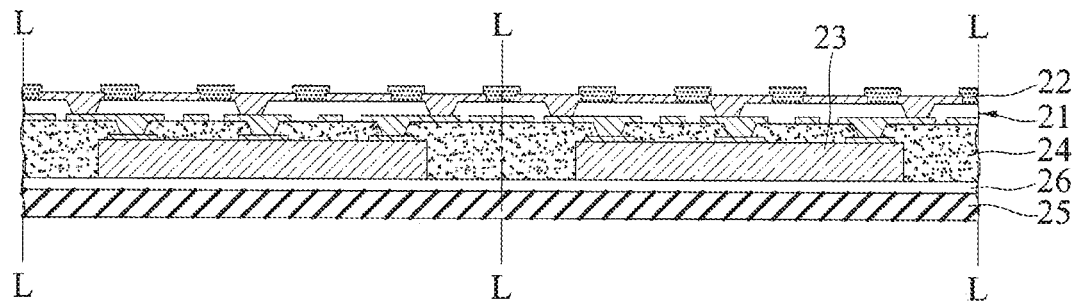
Figure 2C:
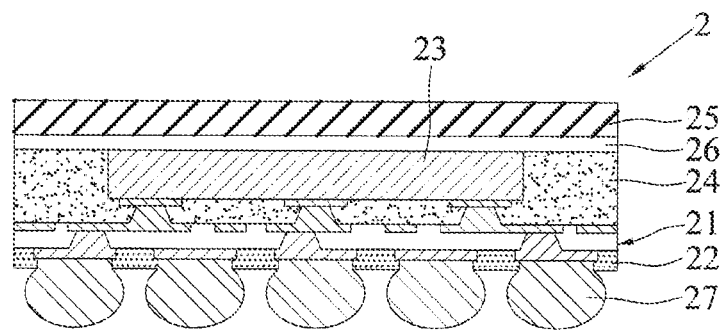
Figure 3A:
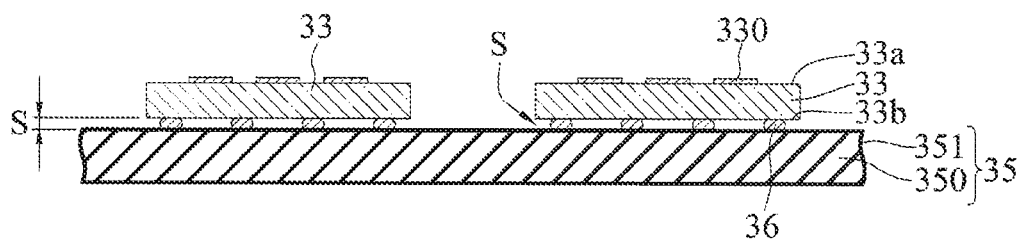
FIGS. 3A to 3D are schematic cross-sectional views of an electronic package according to the present disclosure.

Referring to FIG. 3A, a plurality of electronic components 33 are disposed on a heat dissipating element 35 having a thermal conductive layer 36, and the thermal conductive layer 36 is positioned in a space S formed between the electronic components 33 and the heat dissipating element 35.

In an embodiment, at least one of the electronic components 33 is an active component, such as a semiconductor chip, a passive component, such as a resistor, a capacitor or an inductor, or a combination thereof. In an embodiment, the electronic component 33 has an active surface 33a with a plurality of electrode pads 330 and an inactive surface 33b opposite to the active surface 33a and bonded to the thermal conductive layer 36.

The heat dissipating element 35 is a metal board or a thermal conductive board. In an embodiment, the heat dissipating element 35 comprises a steel board 350 plated with a copper layer 351.

Figure 4A:
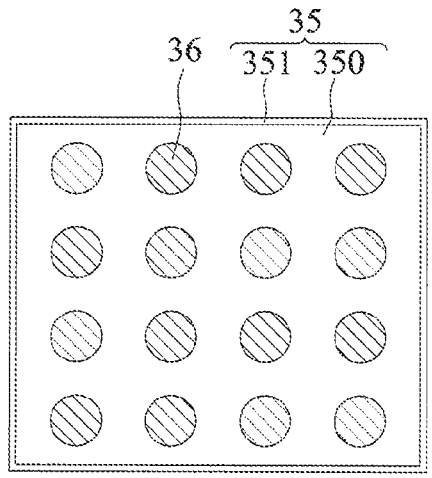
FIG. 4A is a schematic partial upper view of the structure of FIG. 3A.
Figure 4B:
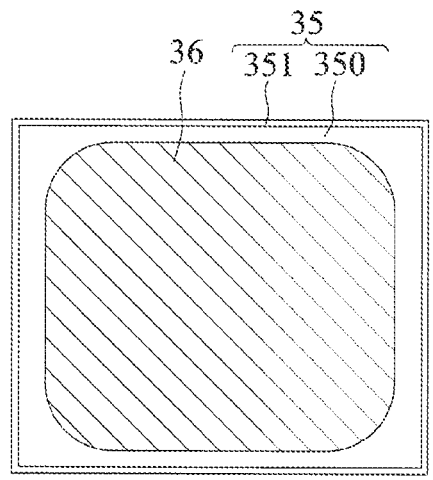
FIGS. 4B to 4H show other embodiments of FIG. 4A.
Figure 4C:
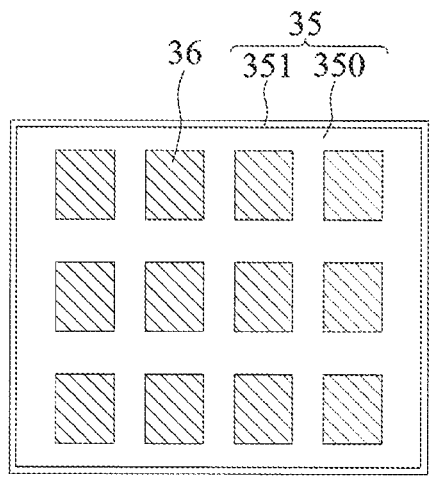
Figure 4D:
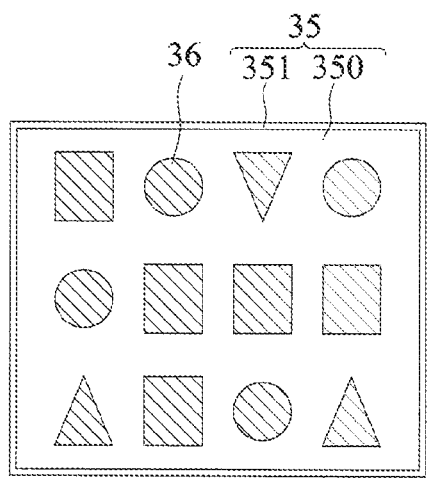
Figure 4E:
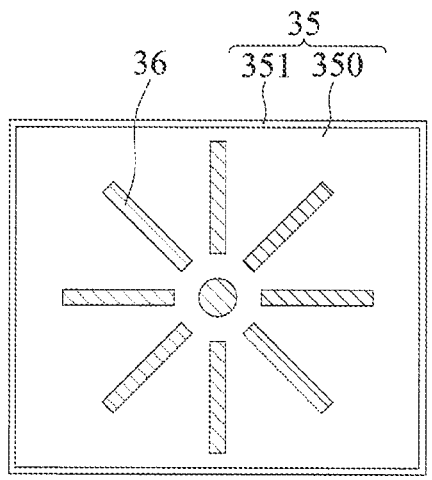
Figure 4F:
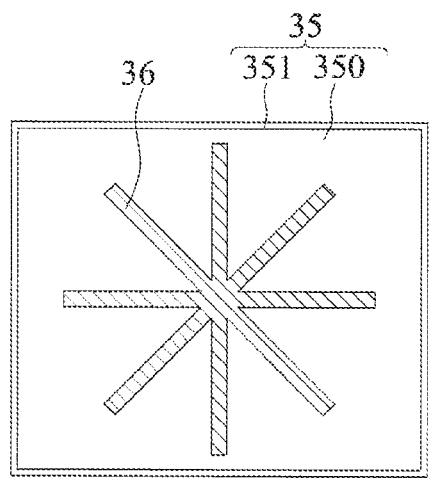
Figure 4G:
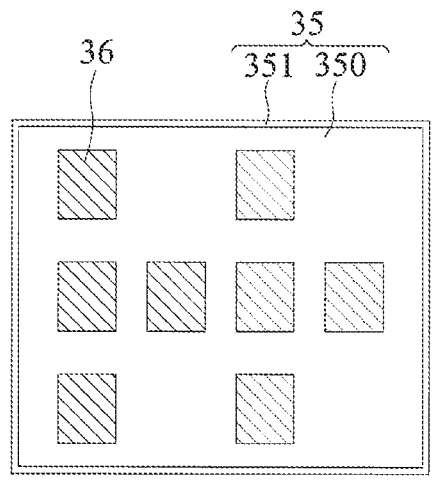
Figure 4H:
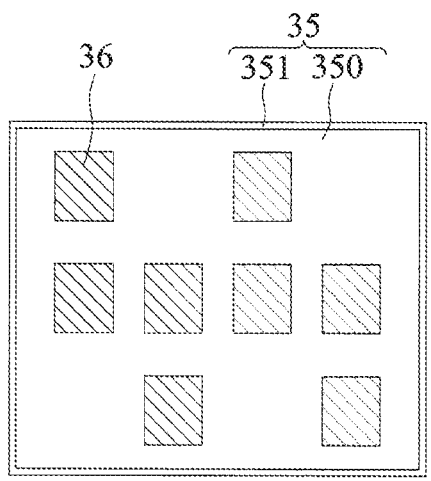

The thermal conductive layer 36 can be made of a metal material, a non-metal material, an organic material, or an inorganic material. In an embodiment, the thermal conductive layer 36 is made of a metal material. In an embodiment, the thermal conductive layer 36 is made of a silver paste, a copper paste or a tin paste that is printed into any pattern and bonded to a portion of the inactive surface 33b of a single electronic component 33. In an embodiment, the thermal conductive layer 36 is formed in a pattern of a plurality of dots corresponding to the single electronic component 33, as shown in FIG. 4A, or a single sheet corresponding to the single electronic component 33, as shown in FIG. 4B. Referring to FIGS. 4C and 4D, the dots have the same or different shapes. Referring to FIGS. 4E and 4F, the thermal conductive layer 36 has a non-continuous symmetrical pattern or a continuous symmetrical pattern. Referring to FIGS. 4G and 4H, the thermal conductive layer 36 has an asymmetrical pattern. Therefore, the thermal conductive layer 36 is formed by printing in a full-panel manner so as to facilitate rapid production of the electronic package 3.

Further, the bonding area accounts for 20 to 80% of the area of the inactive surface 33b.

Figure 3B:
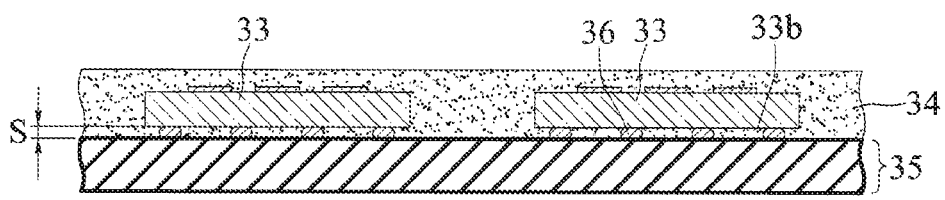

Referring to FIG. 3B, an encapsulant 34 is formed on the heat dissipating element 35 to encapsulate the electronic components 33 and filled in the space S to encapsulate the thermal conductive layer 36. As such, a portion of the inactive surface 33b of each of the electronic components 33 is in contact with the encapsulant 34. The encapsulant 34 differs in material from the thermal conductive layer 36.

In an embodiment, the encapsulant 34 is formed on the heat dissipating element 35 by molding, coating or lamination. Further, the encapsulant 34 is made of a dielectric material, such as an epoxy resin containing a molding compound or a primer, for example, an epoxy molding compound containing 70 to 90 wt % of a filler. The encapsulant 34 is anti-warping.

Figure 3C:
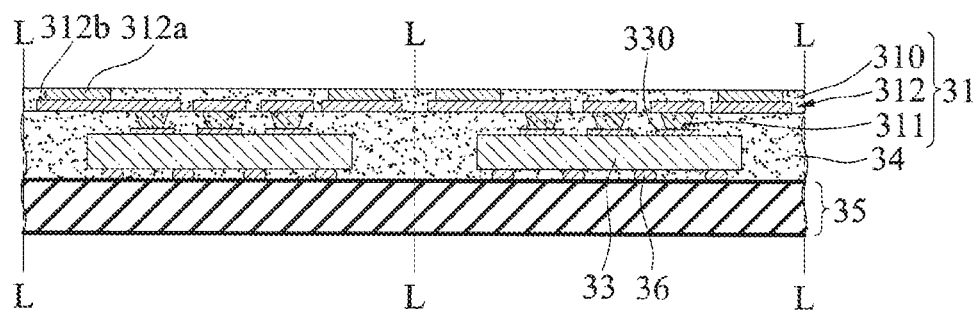

Referring to FIG. 3C, a circuit structure 31 is formed on the encapsulant 34 and electrically connected to the electronic components 33.

In an embodiment, the circuit structure 31 has a first circuit portion 311 formed in the encapsulant 34, at least an insulating layer 310 formed on the encapsulant 34, and at least a second circuit portion 312 embedded in the insulating layer 310. In an embodiment, the first circuit portion 311 comprises a plurality of conductive vias or copper pillars that are electrically connected to the electrode pads 330 of the electronic components 33. The second circuit portion 312 has a circuit layer 312a electrically connected to the first circuit portion 311 and a plurality of conductive pillars 312b stacked on and electrically connected to the circuit layer 312a. The conductive pillars 312b have one ends exposed from the insulating layer 310 to serve as conductive pads for mounting solder balls (not shown).

The insulating layer 310 is formed on the encapsulant 34 by molding, coating or lamination. Further, the insulating layer 310 is made of a dielectric material, such as an epoxy resin containing a molding compound or a primer, for example, an epoxy molding compound containing 70 to 90 wt % of a filler. The insulating layer 310 is anti-warping. It should be understood that the insulating layer 310 and the encapsulant 34 can be made of the same or different materials.

In addition, the circuit structure 31 can be formed through a built-up process or an RDL process.

Figure 3D:
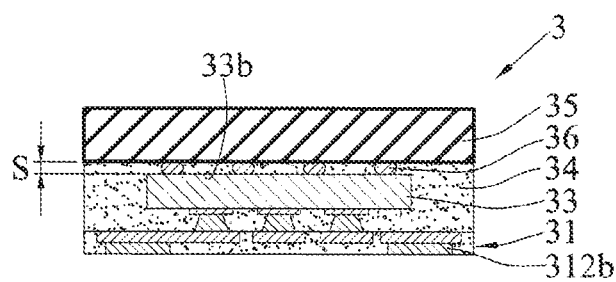

Referring to FIG. 3D, a singulation process is performed along cutting paths L of FIG. 3C to obtain the electronic package 3.

According to the present disclosure, the thermal conductive layer 36 is formed by metal printing and the inactive surface 33b of the electronic component 33 is partially, rather than entirely, bonded to the thermal conductive layer 36. Therefore, the present disclosure speeds up the fabrication process and also saves the material of the thermal conductive layer 36 to reduce the fabrication cost.

Further, by using the thermal conductive layer 36 as a thermal conductive interface between the heat dissipating element 35 and the inactive surface 33b of the electronic component 33, the present disclosure greatly improves the heat dissipating effect of the electronic package 3.

In an embodiment, both the thermal conductive layer 36 and the encapsulant 34 are formed in the space S between the electronic component 33 and the heat dissipating element 35, and the thermal conductive layer 36 facilitates to disperse thermal stresses of the encapsulant 34. Therefore, the present disclosure avoids warping of the thermal conductive layer 36 and the encapsulant 34 in the space S during a subsequent thermal cycling process such as heating or baking so as to prevent peeling of the thermal conductive layer 36 and hence prevent delamination of the heat dissipating element 35.

In addition, since the thermal conductive layer 36 is encapsulated by the encapsulant 34, the present disclosure strengthens the bonding between the electronic component 33 and the thermal conductive layer 36, thereby stabilizing the structural strength of the electronic package 3.

Therefore, the electronic package 3 according to the present disclosure is applicable to high power management ICs or related products with a high heat dissipating requirement.

The present disclosure further provides an electronic package 3, which has: a heat dissipating element 35 having a thermal conductive layer 36 formed on a surface thereof; an electronic component 33 disposed on the heat dissipating element 35, wherein the thermal conductive layer 36 is positioned in a space S formed between the electronic component 33 and the heat dissipating element 35 and comes into contact with the heat dissipating element 35 and the electronic component 33; an encapsulant 34 formed on the heat dissipating element 35 and in the space S to encapsulate the electronic component 33 and the thermal conductive layer 36; and a circuit structure 31 formed on the encapsulant 34 and electrically connected to the electronic component 33.

In an embodiment, the thermal conductive layer 36 is a metal layer.

In an embodiment, the encapsulant 34 is made of a molding compound or a primer.

In an embodiment, one portion of the heat dissipating element 35 is in contact with the thermal conductive layer 36 and another portion of the heat dissipating element 35 is in contact with the encapsulant 34.

In an embodiment, a surface (i.e., the inactive surface 33b) of the electronic component 33 has one portion in contact with the thermal conductive layer 36 and another portion in contact with the encapsulant 34.

In an embodiment, the circuit structure 31 comprises a first circuit portion 311 formed in the encapsulant 34 and electrically connected to the electronic component 33, at least an insulating layer 310 formed on the encapsulant 34, and at least a second circuit portion 312 embedded in the insulating layer 310.

In an embodiment, the insulating layer 310 is made of a molding compound or a primer.

According to the present disclosure, a thermal conductive layer is formed in a portion of the space between the electronic component and the heat dissipating element so as to speed up the fabrication process, reduce the fabrication cost and improve the heat dissipating effect.

Further, an encapsulant is formed in the space between the electronic component and the heat dissipating element to encapsulate the thermal conductive layer, thereby preventing peeling of the thermal conductive layer and strengthening the bonding between the electronic component and the thermal conductive layer.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
a heat dissipating element having a surface with a thermal conductive layer, wherein the thermal conductive layer is in direct contact with a portion of the surface and is free from being formed on the entire surface, and wherein the thermal conductive layer has a non-continuous pattern;

an electronic component disposed on the heat dissipating element, wherein the electronic component has an active surface with a plurality of electrode pads and an inactive surface opposite to the active surface, and the thermal conductive layer is in direct contact with a portion of the inactive surface and is free from being formed on the entire inactive surface, such that the thermal conductive layer is positioned in one portion of a space formed between the inactive surface of the electronic component and the surface of the heat dissipating element and comes into contact with the heat dissipating element and the electronic component;

an encapsulant formed on the heat dissipating element and filled in another portion of the space formed between the inactive surface of the electronic component and the surface of the heat dissipating element and without the thermal conductive layer to encapsulate the electronic component, wherein the heat dissipating has another surface free from being covered with the encapsulant; and a circuit structure formed on the encapsulant and electrically connected to the electrode pads of the electronic component.

2. The electronic package of claim 1, wherein the thermal conductive layer is a metal layer, or made of a silver paste, a copper paste or a tin paste.

3. The electronic package of claim 1, wherein the thermal conductive layer is formed in a pattern of a plurality of dots.

4. The electronic package of claim 3, wherein the dots have the same shape.

5. The electronic package of claim 3, wherein the dots have different shapes.

6. The electronic package of claim 1, wherein the thermal conductive layer has a symmetrical pattern.

7. The electronic package of claim 1, wherein the thermal conductive layer has an asymmetrical pattern.

8. The electronic package of claim 1, wherein the circuit structure comprises a first circuit portion formed in the encapsulant and electrically connected to the electrode pads of the electronic component, an insulating layer formed on the encapsulant, and a second circuit portion embedded in the insulating layer.

9. The electronic package of claim 8, wherein at least one of the insulating layer and the encapsulant is made of a molding compound or a primer.

10. A method for fabricating an electronic package, comprising:

disposing an electronic component on a heat dissipating element having a surface with a thermal conductive layer, wherein the thermal conductive layer is in direct contact with a portion of the surface and is free from being formed on the entire surface, wherein the thermal conductive layer has a non-continuous pattern, and wherein the electronic component has an active surface with a plurality of electrode pads and an inactive surface opposite to the active surface, and the thermal conductive layer is in direct contact with a portion of the inactive surface and is free from being formed on the entire inactive surface, such that the thermal conductive layer is positioned in one portion of a space formed between the inactive surface of the electronic component and the surface of the heat dissipating element and comes into contact with the heat dissipating element and the electronic component;

forming an encapsulant on the heat dissipating element and filling the encapsulant in another portion of the space formed between the inactive surface of the electronic component and the surface of the heat dissipating element and without the thermal conductive layer to encapsulate the electronic component, wherein the heat dissipating has another surface free from being covered with the encapsulant; and forming a circuit structure on the encapsulant and electrically connecting the circuit structure to the electrode pads of the electronic component.

11. The method of claim 10, wherein the thermal conductive layer is a metal layer, or made of a silver paste, a copper paste or a tin paste.

12. The method of claim 10, wherein the thermal conductive layer is formed in a pattern of a plurality of dots.

13. The method of claim 12, wherein the dots have the same shape.

14. The method of claim 12, wherein the dots have different shapes.

15. The method of claim 10, wherein the thermal conductive layer has a symmetrical pattern.

16. The method of claim 10, wherein the thermal conductive layer has an asymmetrical pattern.

17. The method of claim 10, wherein the circuit structure comprises a first circuit portion formed in the encapsulant and electrically connected to the electrode pads of the electronic component, an insulating layer formed on the encapsulant, and a second circuit portion embedded in the insulating layer.

18. The method of claim 17, wherein at least one of the insulating layer and the encapsulant is made of a molding compound or a primer.

\* \* \* \* \*

UNITED STATES PATENT AND TRADEMARK OFFICE
CERTIFICATE OF CORRECTION

PATENT NO. : 10,896,882 B2
APPLICATION NO. : 16/354267
DATED : January 19, 2021
INVENTOR(S) : Hsu et al.

Page 1 of 1

It is certified that error appears in the above-identified patent and that said Letters Patent is hereby corrected as shown below:

On the Title Page

Item (73), the Assignee, is listed as:
PHOENIX & CORPORATION, Grand Cayman (KY)
It should read:
(73) Assignee: PHOENIX PIONEER TECHNOLOGY CO., LTD., Hsinchu County (TW)

Signed and Sealed this
Tenth Day of August, 2021

Drew Hirshfeld
*Performing the Functions and Duties of the*
*Under Secretary of Commerce for Intellectual Property and*
*Director of the United States Patent and Trademark Office*